(12) United States Patent  
Ozaki et al.

(10) Patent No.: US 9,136,799 B2  
(45) Date of Patent: Sep. 15, 2015

(54) AMPLIFIER USING VOLTAGE VARIABLE POWER SUPPLY

(75) Inventors: Seigo Ozaki, Kanagawa (JP); Hirotsugu Kawata, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 359 days.

(21) Appl. No.: 13/808,420

(22) PCT Filed: May 13, 2011

(86) PCT No.: PCT/JP2011/002675  
§ 371 (c)(1),  
(2), (4) Date: Jan. 4, 2013

(87) PCT Pub. No.: WO2012/029210  
PCT Pub. Date: Mar. 8, 2012

(65) Prior Publication Data  
US 2013/0108081 A1   May 2, 2013

(30) Foreign Application Priority Data  
Aug. 30, 2010  (JP) .................................. 2010-191812

(51) Int. Cl.  
*H03G 3/20* (2006.01)  
*H03F 3/185* (2006.01)  
*H03F 1/02* (2006.01)  
*H03F 3/217* (2006.01)  
*H03F 1/32* (2006.01)

(52) U.S. Cl.  
CPC .............. *H03F 3/185* (2013.01); *H03F 1/0211* (2013.01); *H03F 1/0222* (2013.01); *H03F 1/3205* (2013.01); *H03F 3/1855* (2013.01); *H03F 3/2173* (2013.01); *H03F 2200/171* (2013.01); *H03F 2200/504* (2013.01)

(58) Field of Classification Search  
CPC ............................. H03F 1/0222; H03F 1/0233  
USPC ............................................ 330/136; 381/121  
See application file for complete search history.

(56) References Cited

U.S. PATENT DOCUMENTS

| | | | |
|---|---|---|---|
| 8,686,792 B2* | 4/2014 | Sukegawa et al. | 330/136 |
| 2007/0152750 A1* | 7/2007 | Andersen et al. | 330/136 |

FOREIGN PATENT DOCUMENTS

| | | |
|---|---|---|
| JP | 2006-25029 | 1/2006 |
| JP | 2006-238256 | 9/2006 |
| JP | 2007-110646 | 4/2007 |

* cited by examiner

*Primary Examiner* — Steven J Mottola  
(74) *Attorney, Agent, or Firm* — Hamre, Schumann, Mueller & Larson, P.C.

(57) ABSTRACT

An amplifier is capable of reducing the quantization error caused by conversion accuracy in an A/D converter circuit and, particularly, capable of improving the S/N ratio and distortion rate when an input audio signal is small. In an amplifier (1) using a voltage variable power supply (73) as a power supply to follow an input audio signal level (S1) to the amplifier (1) in order to increase or decrease the level of supply voltage supplied to a power amplifier stage (4), when the level of source power of the power amplifier stage (4) is changed, the voltage level of a reference voltage supplied to an A/D converter (62) of a negative feedback circuit is controlled.

4 Claims, 5 Drawing Sheets

61  ATTENUATOR  
71  INPUT SIGNAL LEVEL DETECTION  
73  VOLTAGE VARIABLE POWER SUPPLY PART

AMPLIFIER USING VOLTAGE VARIABLE POWER SUPPLY

TECHNICAL FIELD

The present invention relates to an amplifier for inputting a digital signal, and particularly to an amplifier for negatively feeding an output signal back to a digital signal input part to improve the S/N ratio and distortion of the output signal.

BACKGROUND ART

Conventionally, there has been a technique for using a voltage variable power supply as the power supply of an amplifier to follow the level of an input audio signal so the amplifier in order to increase or decrease the level of supply voltage supplied to a power amplifier stage, thereby reducing noise superimposed on an output signal and improving the power efficiency of the power supply.

Thus, the supply voltage supplied to the power amplifier stage is made to follow the input audio signal level. When the input audio signal level is low, since the supply voltage at the power amplifier stage can be reduced to a voltage level with an amplitude that does not distort the amplified signal, the noise superimposed on the output signal of the amplifier can be reduced and the power efficiency of the power supply can be improved.

Further, the output signal is negatively fed back to a signal input part so that the noise or distortion superimposed on the output signal can be corrected.

In this case, when the supply voltage supplied to the power amplifier stage is reduced, the amplification gain of the amplifier clue to voltage amplification at the power amplifier stage also drops. Therefore, there is known a technique for adjusting the gain of gain adjustment means provided in a feedback loop according to an increase or decrease in the level of voltage supplied to a switching amplifier of a signal reproducer to adjust the gain of a negative feedback loop to keep the gain constant (see Patent Document 1).

CITATION LIST

Patent Document

Patent Document 1 Japanese Patent. Laid-Open Application No. 2007-110646

SUMMARY OF THE INVENTION

Problem to be Solved by the Invention

However, the conventional amplifier needs to provide, in a negative feedback circuit, an analog/digital converter (hereinafter referred to as an A/D converter) for converting an analog signal to a digital signal after an amplified output signal is attenuated to a predetermined voltage level in order to negatively feed the output signal to a digital signal input part. This causes a problem that noise or distortion to be corrected through negative feedback is not corrected by an amount corresponding to quantization error resulting from the conversion accuracy of this A/D converter.

In other words, in the amplifier having the negative feedback circuit, the A/D converter inserted in the negative feedback circuit is required to make a high-speed conversion in order to ensure the stable operation of the amplifier. However, the A/D converter capable of making a high-speed conversion has a problem that the conversion accuracy cannot be ensured sufficiently due to the theoretical limitations on conversion processing capacity.

The present invention has been made to solve the conventional problem, and it is an object thereof to provide an amplifier using a voltage variable power supply as the power supply to follow the level of an input audio signal to the amplifier in order to increase or decrease the level of supply voltage supplied to a power amplifier stage, wherein when the voltage level of the source power of a power amplifier stage is changed, the level of reference voltage supplied to an A/D converter in a negative feedback circuit is so controlled that the amount of quantization error resulting from the conversion accuracy of the A/D converter circuit can be reduced to improve the S/N ratio and the distortion rate especially when an input audio signal is small.

Means for Solving the Problem

In order to attain the above object, the amplifier of the present invention includes: a supply voltage control part for detecting the amplitude level of an input audio signal and outputting power of a voltage level indicated by target set voltage level information corresponding to the detected amplitude level; a PWM conversion part for converting the input audio signal to a pulse width modulation signal; power amplifier stage for performing power amplification on the pulse width modulation signal output from the PWM conversion part; a low-pass filter part (hereinafter referred to as the LPF part) for demodulating the amplified PWM signal output from the power amplifier stage into an acoustic signal; a negative feedback part for attenuating the acoustic signal demodulated in the LPF part, converting the attenuated acoustic signal into a digital signal through an A/D converter, and negatively feeding the digital signal back to the PWM conversion part; and a voltage conversion part for outputting voltage proportional to the voltage level of power output by the supply voltage control part, wherein the voltage output by the voltage conversion part is used as a reference voltage level of the A/D converter.

Advantageous Effect of the Invention

According to the present invention, even when an input signal is small, the conversion accuracy of the A/D converter in the negative feedback circuit can be kept high, having an advantage over the conventional technique in that conversion error in the negative feedback circuit is reduced even in the case of a small input signal so that the S/N ratio and the distortion rate of an output signal can be improved.

MODE FOR CARRYING OUT THE INVENTION

An amplifier 1 according to a preferred embodiment of the present invention will now be described with reference to a block diagram of FIG. 1.

Figure 1:
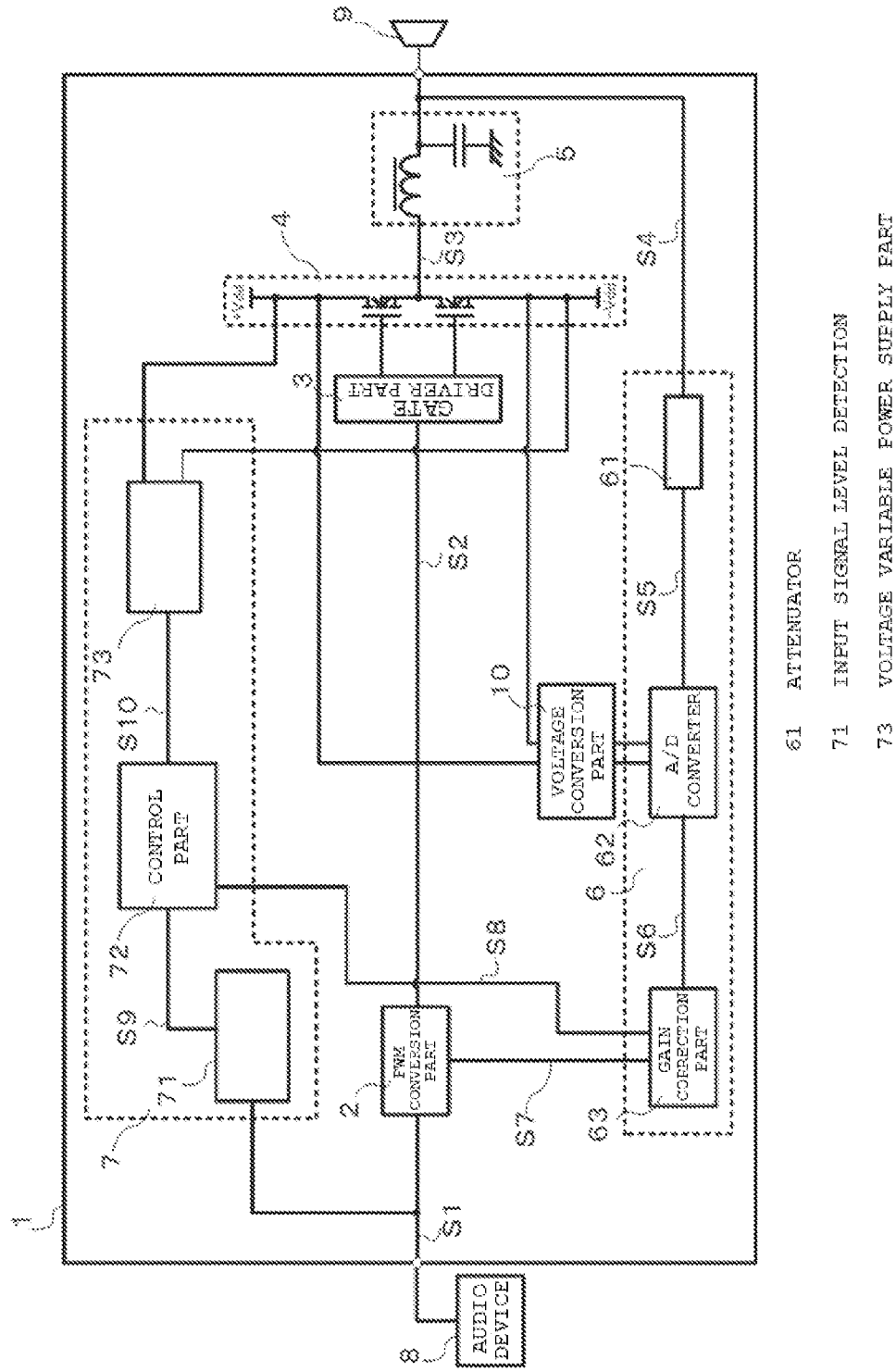
FIG. 1 It is a block diagram of an amplifier 1 according to a preferred embodiment of the present invention.

In FIG. 1, the amplifier 1 of the embodiment is connected to an audio device 8 from which a digital audio signal is output.

The audio signal output from the audio device 8 is input into the amplifier 1 as an input audio signal S1 of the amplifier 1, the power of which is amplified in the amplifier 1 and output to a speaker 9. The speaker 9 converts, to sound, the audio signal output from the amplifier 1 after being subjected to power amplification, and emits the sound.

Further, the amplifier 1 and the audio device 8 are connected to a DC power supply (not shown) for supplying power required to activate these devices. Note that the power supply required to activate each device is not limited to the DC power supply, and an AC power supply may be used arbitrarily according to the features of each device.

Combined the audio device 8 and the amplifier 1 is defined as an audio output device, and combined the audio output device and the speaker 9 is defined as an audio system.

The amplifier 1 is configured to include a PWM conversion part 2, a gate driver part 3, a power amplifier stage 4, an LPF part 5, a negative feedback part 6, a supply voltage control part 7, and a voltage conversion part 10.

When an audio signal is input from the audio device 8 to the amplifier 1, the input audio signal S1 is input into the supply voltage control part 7 and the PWM conversion part 2.

The supply voltage control part 7 detects the amplitude level of the input audio signal S1 input from the audio device 8, selects a gain correction value S8 corresponding to the detected amplitude level of the input audio signal S1 and target set voltage level information S10, outputs the gain correction value S8 to the negative feedback part 6, controls the positive and negative output voltage so become a target voltage as a voltage level indicated by the target set voltage level information S10, and sends source power of this positive and negative voltage level to the power amplifier stage 4.

The PWM conversion part 2 calculates a differential signal including an error component between a corrected digital feedback signal S7 input from the negative feedback part 6 and the input audio signal S1 input from the audio device 8, converts the differential signal to a PMW signal S2, and sends the PWM signal S2 to the gate driver part 3.

As PWM conversion methods, a delta-sigma conversion method and a triangular wave comparison method are known. In the embodiment, either of the methods is applied.

Here, the PWM conversion part 2 can be implemented by a digital signal processor or a microcontroller.

The gate driver part 3 inserts a dead time into the input PWM signal 32, creates a drive signal obtained by shifting the potential of the PWM signal S2 to such a degree that high-side and low-side high-speed switching elements of the power amplifier stager 4 can be driven, and sends the drive signal to the power amplifier stage 4.

The power amplifier stage 4 is configured as a half-bridge circuit including a high-side high-speed switching element arranged on a high-potential power supply side and supplied with a positive-side voltage from the supply voltage control part 7, and a low-side high-speed switching element arranged on a low-potential power supply (or grounded) side and supplied with a negative-side voltage from the supply voltage control part 7.

The power amplifier stage 4 performs a high-speed switching operation with a voltage amplitude determined by the positive-side voltage and the negative-side voltage based on the drive signal input from the gate driver part 3 so that the signal input to the power amplifier stage 4 will be subjected to power amplification to obtain an amplified PWM signal S3.

The amplified PWM signal S3 obtained is input to the LPF part 5. Here, as the high-speed switching element, for example, an MOS field-effect transistor or the like is used.

The LPF part 5 is a filter for outputting, to the speaker 9 and the negative feedback part 6, an amplified analog audio signal S4 obtained by removing unnecessary high-frequency components from the amplified PWM signal S3 output from the power amplifier stage 4 For example, the LPF part 5 is composed of elements such as a coil and a capacitor.

The negative feedback part 6 attenuates the amplified analog audio signal S4 output from the LPF part 5, converts the attenuated signal to a digital signal by using a positive-side reference voltage level Vrp and a negative-side reference voltage level Vrn input from the voltage conversion part 10, corrects the magnitude of the converted digital signal by a predetermined ratio, and negatively feeds the corrected digital signal back to the PWM conversion part 2 as a corrected digital feedback signal S7.

Here, the amplifier 1 in the embodiment is so configured that the amplified analog audio signal S4 output from the LPF part 5 is input into the negative feedback part 6. Thus, since the amplified analog audio signal S4 output from the LPF part 5 is input into the negative feedback part 6, rather than that the amplified PWM signal S3 output from the power amplifier stage 4 is input into the negative feedback part 6, a distortion generated in the LPF part 5 is also corrected through the negative feedback, so that the distortion rate can further be improved.

The positive-side voltage level +Vdd and the negative-side voltage level −Vdd of the source power supplied to the power amplifier stage 4 are input into the voltage conversion part 10. The voltage conversion part 10 steps down the input positive-side voltage level +Vdd and negative-side voltage level −Vdd by a preset certain ratio to create a positive-side reference voltage level Vrp and a negative-side reference voltage level Vrn, and outputs the created positive-side reference voltage level Vrp and negative-side reference voltage level Vrn to the negative feedback part 6.

Figure 2:
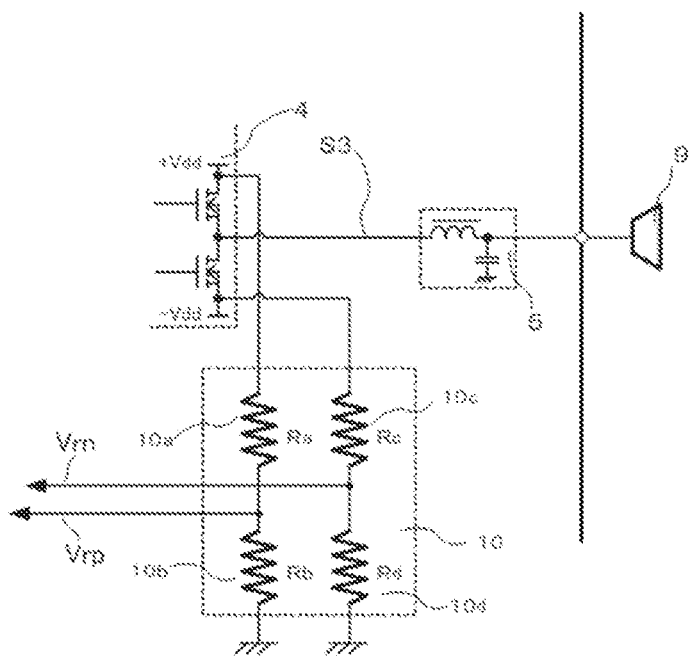
FIG. 2 It is a diagram of the structure of a voltage conversion part 10 according to the embodiment of the present invention.

In the simplest case, the voltage conversion part 10 is implemented by two pairs of two resistive elements connected in series as shown in FIG. 2 to step down the positive-side voltage level +Vdd and the negative-side voltage level −Vdd by ratios of the resistance values Ra, Rb, and Rc, Rd of the two resistive elements (10a, 10b, and 10c, 10d), respectively, in order to create the positive-side reference voltage level Vrp and the negative-side reference voltage level Vrn. The positive-side reference voltage level Vrp and the negative-side reference voltage level Vrn are output respectively from the connecting points of the two resistive elements to the negative feedback part 6.

Further, the detailed structure and operation of the supply voltage control part 7 and the negative feedback part 6 will be described with reference to the block diagram of FIG. 1.

The supply voltage control part 7 is configured to include an input signal level detection part 71, a control part 72, and a voltage variable power supply part 73.

The input signal level detection part 71 creates input signal amplitude level information S9 including amplitude information on the input audio signal S1 input from the audio device 8, and sends the input signal amplitude level information S9 to the control part 72.

The control part 72 selects, from data table information preset in the control part 72, target set voltage level information S10 and a gain correction value S8 corresponding to the input signal amplitude level information S9 created by the input signal level detection part 71, outputs the selected target set voltage level information S10 to the voltage variable power supply part 73, and outputs the gain correction value S8 to the negative feedback part 6.

The target set voltage level information S10 is information indicative of a target value of the voltage level to be set for the voltage variable power supply part 73, and the gain correction value S8 is information indicative of a correction constant preset according to the target value of the voltage level to be set.

The voltage variable power supply part 73 is a power supply for varying the output voltage to a voltage level to be set according to the target set voltage level information S10 input from the control part 72 and supplying, to the power amplifier stage 4, source power of the voltage level controlled based on the target set voltage level information S10.

The input signal level detection part 71 and the control part 72 can be implemented by a digital signal processor or a microcontroller. The negative feedback part 6 is configured to include an attenuator 61, an A/D converter 62, and a gain correction part 63.

The amplified analog audio signal S4 output from the LPF part 5 is input to the attenuator 61. The attenuator 61 attenuates the signal by a preset ratio to create an attenuated analog feedback signal S5, and outputs the created attenuated analog feedback signal S5 to the A/D converter 62.

The attenuator 61 is implemented by two resistive elements connected in series to attenuate the amplified analog audio signal S4 by a ratio of preset resistance values of the two resistive elements.

The attenuated analog feedback signal S5 output from the attenuator 61, and the positive-side reference voltage level Vrp and the negative-side reference voltage level Vrn output from the voltage conversion part 10 are input into the A/D converter 62, respectively. The A/D converter 62 creates a digital feedback signal S6 as a result of comparison between a reference voltage level (to be described in detail later), created by dividing the positive-side reference voltage level Vrp and the negative-side reference voltage level Vrn at a predetermined rate, and the input attenuated analog feedback signal S5, and outputs the created digital feedback signal S6 to the gain correction part 63.

Here, the A/D converter 62 has a structure including at least multiple resistive elements and a capacitor array connected, and is defined as a converter of the type that compares the input analog signal with a reference voltage level. There are known a parallel type, a series-parallel type, and a subranging type.

The digital feedback signal S6 output from the A/D converter 62 and the gain correction value S8 output from the control part 72 are input into the gain correction part 63, respectively. The gain correction part 63 corrects the magnitude of the digital feedback signal S6 by an amount corresponding to the gain correction value S8, and outputs a corrected digital feedback signal S7 to the PWM conversion part 2. The gain correction part 63 can be implemented by a multiplier or the like provided in a digital signal processor or a microcontroller.

Here, the detailed structure of the A/D converter 62 and the operation of converting an analog signal to a digital signal will be described with reference to FIG. 3 by taking a parallel A/D converter as an example.

Figure 3:
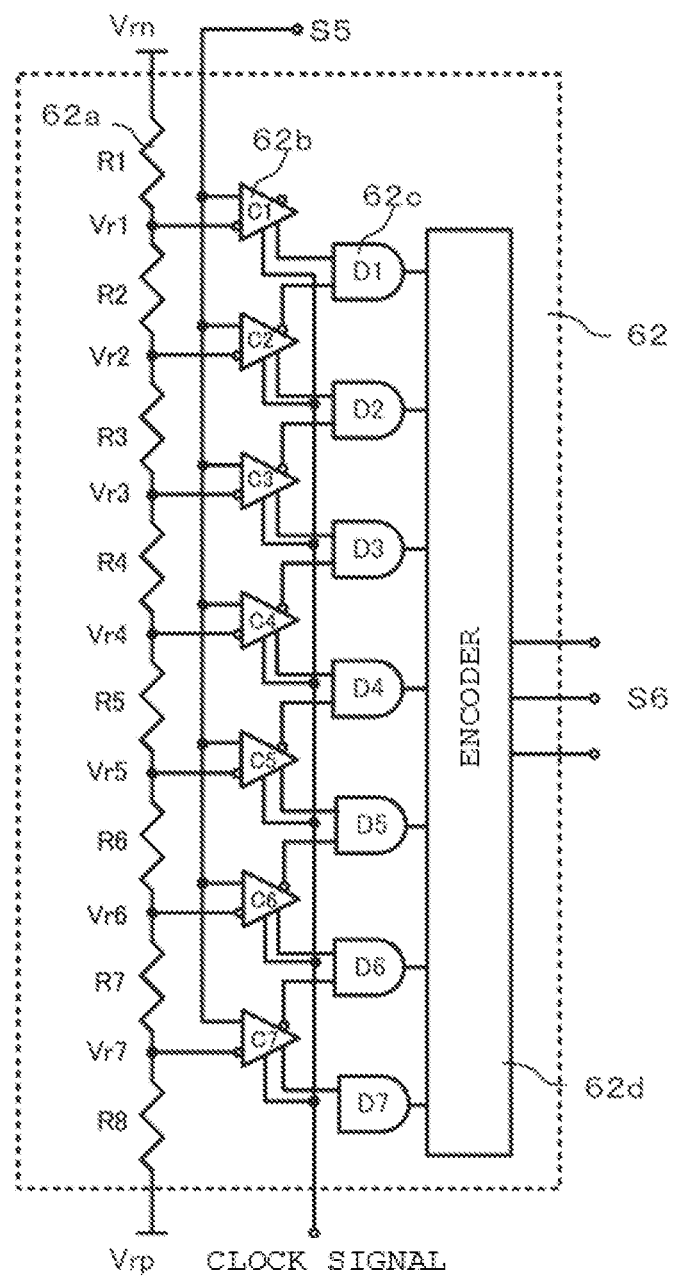
FIG. 3 It is a diagram of the structure of an A/D converter 62 according to the embodiment of the present invention.

As shown in FIG. 3, the parallel A/D converter is made up of a reference resistor array 62a with unit resistors R1 to R8 connected in series, a comparator group 62b (in the drawing, respective comparators are expressed as C1 to C7) for comparing each of the potentials Vr1 to Vr7 at each of the connecting points of the unit resistors in the reference resistor array 62a with the potential of the attenuated analog feedback signal input, a logic circuit group 62c (in the drawing, respective logic circuits are expressed as D1 to D7) to which outputs as the comparison results of the comparator group 62b are input, and an encoder 62d for converting each output of the logic circuit group 62c into data of a predetermined number of bits.

One end of the reference resistor array 62a is connected to the positive-side reference voltage level Vrp output from the voltage conversion part 10, and the other end is connected to the negative-side reference voltage level Vrn.

A clock signal is input from an external clock circuit (not shown) to each of the comparators C1 to C7 in the comparator group 62b.

Each of the potentials Vr1 to Vr7 at each of the connecting points of the unit resistors in the reference resistor array 62a is input to one terminal of each of the comparators C1 to C7 in the comparator group 62b. The comparator compares the magnitude of the potentials Vr1 to Vr7 at the connecting points with the magnitude of the potential of the attenuated analog feedback signal S5 input to the other terminal. When the potential of the attenuated analog feedback signal S5 is larger than the potentials Vr1 to Vr7 at the connecting points, 1 is output, while when the potential of the attenuated analog feedback signal S5 is smaller than the potentials Vr1 to Vr7 at the connecting points, 0 is output.

The output of each of the comparators C1 to C7 is latched on the rising edge of the clock signal to hold the output state.

Each of non-inverted and inverted outputs is input from each of adjacent comparators C1 to C7 in the comparator group 62b into each of the logic circuits D1 to D7 in the logic circuit group 62c, and the result of the logical operation AND between two terminal inputs is output to the encoder 62d.

The encoder 62d converts the output of each of the logic circuits D1 to D7 into data of a predetermined number of bits, and outputs the data.

Here, an operation for performing variable control on the positive-side reference voltage level Vrp and the negative-side reference voltage level Vrn of the parallel A/D converter 62 taken as an example to reduce the instantaneous value of quantization error generated in the parallel A/D converter 62 will be described with reference to FIG. 4 and FIG. 5.

First, the general concept of quantization error will be described with reference to FIG. 5. The quantization means converting an analog signal to a digital signal, which is defined as converting continuous analog values into discrete digital values. When the range of analog values contained in one digital value is expressed as 1 LSB, the 1 LSB range of continuous analog values are all output as the same digital value as shown. Therefore, when an analog value at 0.5 LSB position from the center of 1 LSB is converted to a digital value, the instantaneous value of error reaches its peak (maximum).

For example, when the range of analog values is 4.5 to 5.5, all analog values are converted to a digital value of 5. Therefore, when the analog values are 4.5 and 5.5, the instantaneous values of error reach their peaks (maximums).

Figure 5:
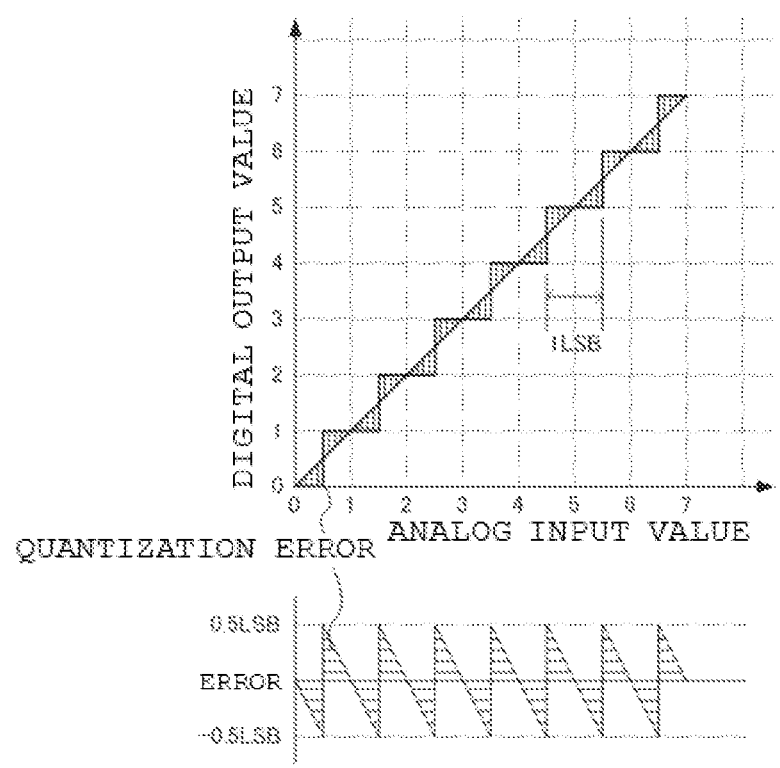
FIG. 5 It is a chart for describing the magnitude of quantization error according to the embodiment of the present invention.

As shown in FIG. 5, when the center of 1 LSB is set to 0, the quantization error is distributed in a range of ±0.5 LSB. Thus, the wider the 1 LSB range, the larger the quantization error.

Figure 4:
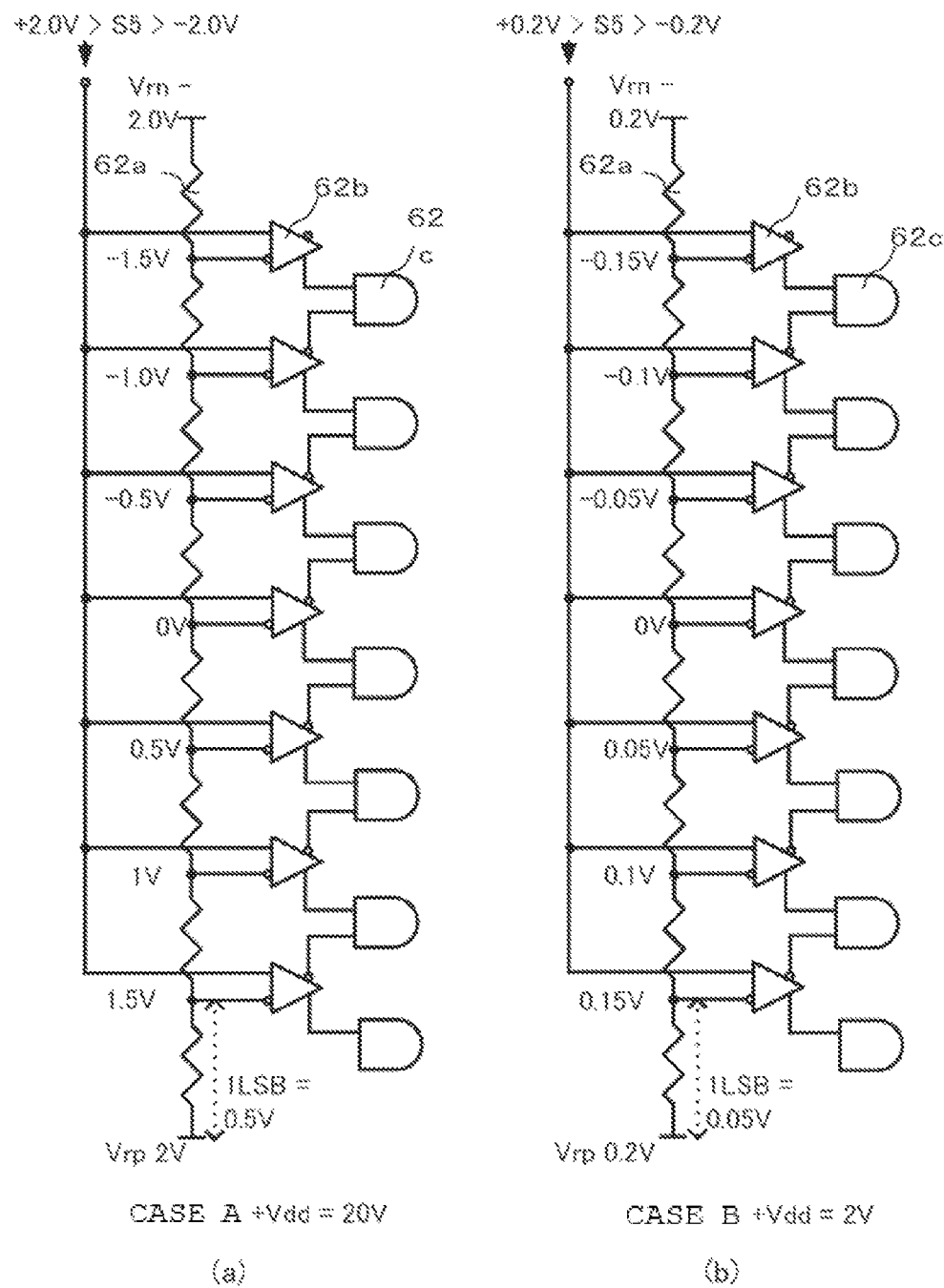
FIG. 4 It is a diagram for describing the states of change in the reference voltage level of the A/D converter 62 according to the embodiment of the present invention, in which (a) indicates a case where supply voltage supplied to a power amplifier stage 4 is ±20 V and (b) indicates a case where supply voltage supplied to the power amplifier stage 4 is ±2 V.

Referring next to FIG. 4, an operation in which values in the 1 LSB range vary when reference voltage levels Vrp and Vrn created corresponding to the voltage level of the source power of the power amplifier stage 4, which is controlled by detecting the amplitude level of the input audio signal S1 in the parallel A/D converter 62, are changed will be described.

FIG. 4 shows case A (FIG. 4(a)) where the positive-side voltage level +Vdd of source power supplied to the power amplifier stage 4 in the parallel A/D converter 62 is 20 V and the negative-side voltage level −Vdd is −20 V, and case B (FIG. 4(b)) where the positive-side voltage level +Vdd is 2 V and the negative-side voltage level −Vdd is −2 V.

Here, the predetermined ratio by which the voltage conversion part 10 steps down the voltage level of source power is set to 1/10.

Case A is a case where the positive-side voltage level +Vdd of source power supplied to the power amplifier stage 4 is 20 V. In this case, a voltage level of 2 V obtained by the voltage conversion part 10 stepping down +Vdd by she ratio of 1/10 is input as the positive-side reference voltage level Vrp.

Similarly, a voltage level of −2 V obtained by the voltage conversion part 10 stepping down the negative-side voltage level −Vdd of source power by the ratio of 1/10 is input as the negative-side reference voltage level Vrn.

Since the potentials Vr1 to Vr7 at the connecting points of the reference resistor array 62a made up of the unit resistors connected in series are obtained by dividing the potentials of the positive-side reference voltage level Vrp and the negative-side reference voltage level Vrn into equally-spaced potentials, the potential at adjacent connecting points becomes 0.5 V. This value of the potential at adjacent connecting points is set to 1 LSB. In case A, 1 LSB is 0.5 V.

Case B is a case where the positive-side voltage level +Vdd of source power supplied to the power amplifier stage 4 is 2 V. In this case, a voltage level of 0.2 V obtained by the voltage conversion part 10 stepping down +Vdd by the ratio of 1/10 is input as the positive-side reference voltage level Vrp.

Similarly, a voltage level of −0.2 V obtained by the voltage conversion part 10 stepping down the negative-side voltage level −Vdd of source power by the ratio of 1/10 is input as the negative-side reference voltage level Vrn.

Since the potentials Vr1 to Vr7 at the connecting points of the reference resistor array 62a made up of the unit resistors connected in series are obtained by dividing the potentials of the positive-side reference voltage level Vrp and the negative-side reference voltage level Vrn into equally-spaced potentials, the potential at adjacent connecting points becomes 0.05 V. In case B, 1 LSP is 0.05 V.

From the results described with reference to FIG. 4 and FIG. 5, it can be found in a comparison between case A and case B of FIG. 4 that the instantaneous value of quantization error is more reduced in case B than in case A by an amount of change in the value of 1 LSB from 0.5 V to 0.05 V due to changes in the reference voltage levels Vrp and Vrn of the A/D converter 62 controlled corresponding to the amplitude level of the input audio signal S1.

In the embodiment, the low-side high-speed switching element of the power amplifier stage 4 is arranged on the low-potential power supply side, but the structure may also be such that the low-side high-speed switching element is connected to the ground and the voltage variable power supply part 73 is a single output power supply. In this case, is is desired to add a large-capacitance DC-cut capacitor between the power amplifier stage 4 and the speaker 9.

The structure may further be such that the voltage variable power supply part 73 is a single output power supply and the power amplifier stage 4 is a full-bridge circuit.

When the voltage variable power supply part 73 is a single output power supply, the number of pairs of resistive elements in the voltage converter part 10 can be changed to one and the number of analog reference voltages in the A/D converter 62 can be changed to one.

As described above, according to the embodiment of the present invention, in the amplifier 1 using the voltage variable power supply part 73 as the power supply to follow the input audio signal level S1 to the amplifier 1 in order to increase or decrease the level of the supply voltage supplied to the power amplifier stage 4, when the voltage level of source power of the power amplifier stage 4 is changed, the level of a reference voltage supplied to the A/D converter 62 in the negative feedback circuit is so controlled that the quantization error resulting from in conversion accuracy in the A/D converter circuit 62 can be reduced, enabling an improvement in the S/N ratio and the distortion rate especially when an input audio signal is small.

INDUSTRIAL APPLICABILITY

The amplifier of the present invention negatively feeds an amplified output signal back to the digital signal input part. Thus, the amplifier is useful as an amplifier for improving the S/N ratio and distortion of an output signal.

DESCRIPTION OF REFERENCE NUMERALS AND SYMBOLS

1 Amplifier
2 PWM Conversion Part
3 Gate Driver Part
4 Power Amplifier Stage
5 LPF Part
6 Negative Feedback Part
7 Supply Voltage Control Part
8 Audio Device
9 Speaker
10 Voltage Conversion Part
10a Resistance Ra
10b Resistance Rb
10c Resistance Rc
10d Resistance Rd
61 Attenuator
62 A/D Converter
62a Reference Resistor Array
62a Comparator Group
62c Logic Circuit Group
62d Encoder
63 Gain Correction Part
71 Input Signal Level Detection Part
72 Control Part
73 Voltage Variable Power Supply Part

The invention claimed is:
1. An amplifier comprising:
a supply voltage control part for detecting an amplitude level of an input audio signal and outputting power of a voltage level indicated by target set voltage level information corresponding to the detected amplitude level;
a PWM conversion part for converting the input audio signal to a pulse width modulation signal;
a power amplifier stage for performing power amplification on the pulse width modulation signal output from the PWM conversion part;

a low-pass filter part for demodulating the amplified PWM signal output from the power amplifier stage into an acoustic signal;

a negative feedback part for attenuating the acoustic signal demodulated in the low-pass filter part, converting the attenuated acoustic signal into a digital signal through an A/D converter, and negatively feeding the digital signal back to the PWM conversion part; and a voltage conversion part for outputting voltage proportional to the voltage level of power output by the supply voltage control part, wherein the voltage output by the voltage conversion part is used as a reference voltage level of the A/D converter.

2. The amplifier according to claim 1, characterized in that the voltage conversion part is made up of two pairs of two resistive elements connected in series.

3. An audio output device comprising:

an audio device for generating and outputting an input audio signal; and the amplifier according to claim 1, into which the input audio signal is input.

4. An audio system comprising:

the audio output device according to claim 3; and a speaker into which the acoustic signal output from the audio output device is input.

* * * * *